United States Patent
Ventzek et al.

(10) Patent No.: US 10,910,196 B1
(45) Date of Patent: Feb. 2, 2021

(54) MODE-SWITCHING PLASMA SYSTEMS AND METHODS OF OPERATING THEREOF

(71) Applicant: Tokyo Electron Limited, Tokyo (JP)

(72) Inventors: Peter Ventzek, Austin, TX (US); Alok Ranjan, Austin, TX (US); Mitsunori Ohata, Miyagi (JP); Michael Hummel, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/521,340

(22) Filed: Jul. 24, 2019

(51) Int. Cl.
*H01J 37/32* (2006.01)
*H01L 21/02* (2006.01)
*H01L 21/3213* (2006.01)

(52) U.S. Cl.
CPC ...... *H01J 37/32174* (2013.01); *H01J 37/321* (2013.01); *H01J 37/32091* (2013.01); *H01J 37/32568* (2013.01); *H01J 37/32605* (2013.01); *H01L 21/0262* (2013.01); *H01L 21/32136* (2013.01); *H01J 2237/3321* (2013.01); *H01J 2237/3341* (2013.01)

(58) Field of Classification Search
CPC ............... H01J 37/32; H01J 37/32174; H01J 37/32091; H01J 37/321; H01J 37/3211; H01J 37/32605; H01J 37/32568
See application file for complete search history.

(56) References Cited

U.S. PATENT DOCUMENTS

| | | | |
|---|---|---|---|
| 5,151,663 A * | 9/1992 | Harvey | H03F 21/00 315/111.21 |
| 5,662,819 A * | 9/1997 | Kadomura | C23F 4/00 438/711 |
| 7,096,819 B2 * | 8/2006 | Chen | H01J 37/321 118/723 I |
| 9,627,181 B2 * | 4/2017 | Yamazawa | H01J 37/3211 |
| 2012/0074100 A1 * | 3/2012 | Yamazawa | H01J 37/32174 216/68 |

OTHER PUBLICATIONS

Donnelly, Vincent et al., "Plasma etching: Yesterday, today, and tomorrow," J. Vac. Science Technology A 31(5), Sep./Oct. 2013, 48 pages.
Hori, Masaru, et al., "Radical-controlled plasma processing for nanofabrication," Journal of Physics D: Applied Physics 44, Apr. 2011, 174027, 17 pages.
Lieberman, Michael A., et al., "Principles of Plasma Discharges and Materials Processing," Second Edition, Wiley-Interscience, Apr. 8, 2005, 794 pages.
Ventzek, Peter L. G., et al., "Investigation of electron source and ion flux uniformity in high plasma density inductively coupled etching tools using two-dimensional modeling," J. Vac. Science Technology B 12(6), Nov./ Dec. 1994, 20 pages.
Ventzek, Peter L. G., et al., "Two-dimensional modeling of high plasma density inductively coupled sources for materials processing," J. Vac. Science Technology B 12(1), Jan./Feb. 1994, 17 pages.

* cited by examiner

*Primary Examiner* — Thai Pham
(74) *Attorney, Agent, or Firm* — Slater Matsil, LLP

(57) ABSTRACT

In one embodiment, a plasma processing system includes a plasma processing chamber, a substrate holder disposed in the plasma processing chamber, a coil disposed over the plasma processing chamber, and a plurality of taps configured to contact the coil at an associated contact region. The plasma processing system is configured to sustain a plasma by selecting a subset of taps from the plurality of taps to apply a power source and a reference potential.

20 Claims, 11 Drawing Sheets

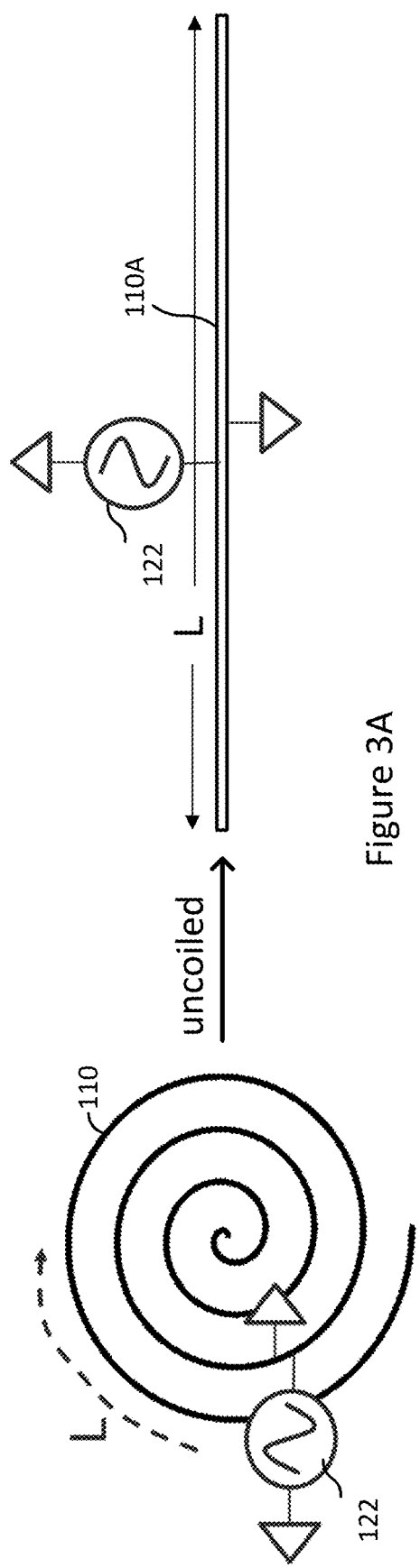
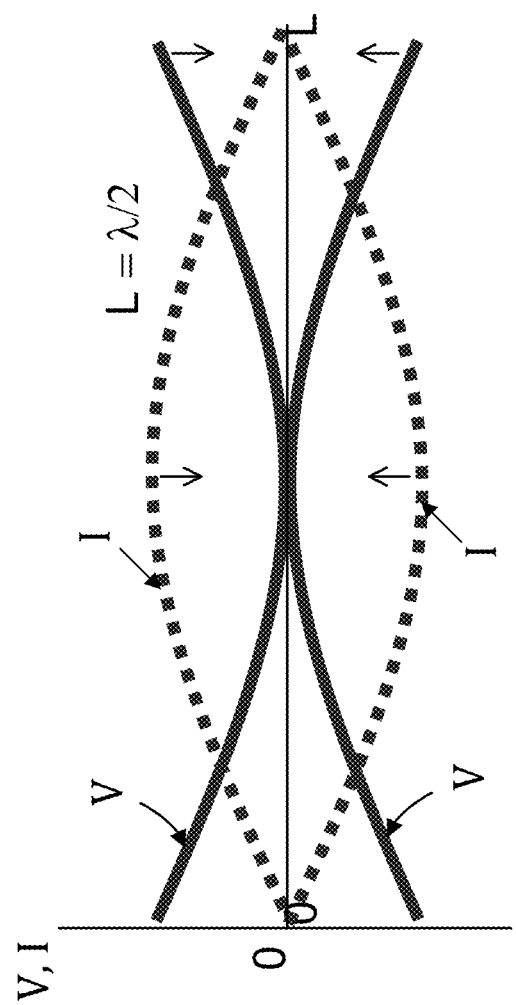
Figure 3A
Figure 3B

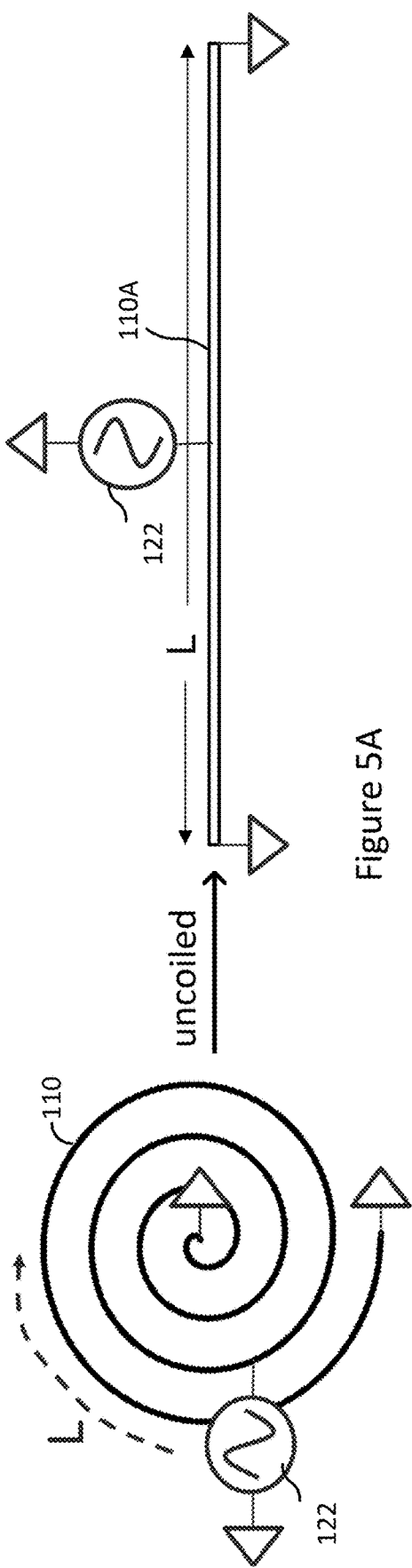
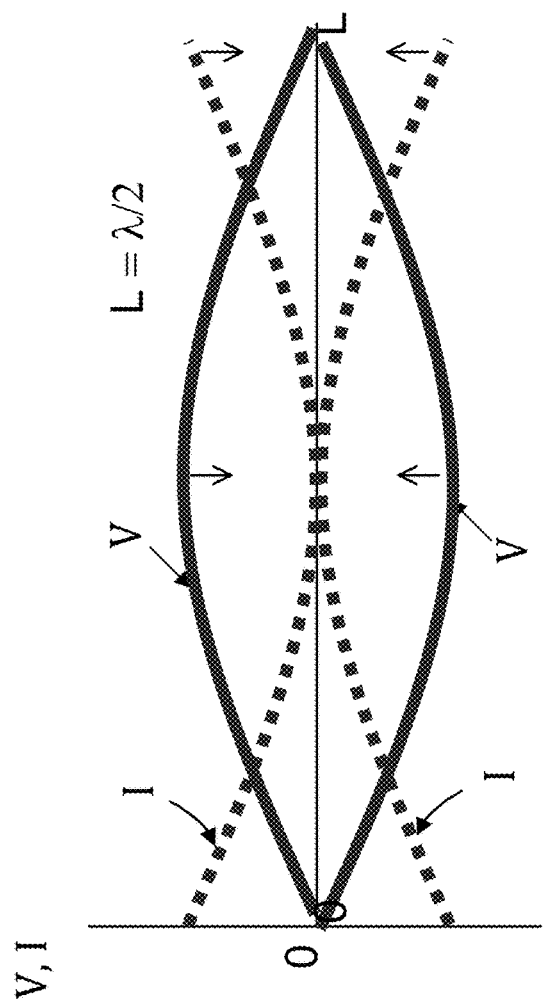
Figure 5A
Figure 5B

MODE-SWITCHING PLASMA SYSTEMS AND METHODS OF OPERATING THEREOF

TECHNICAL FIELD

The present invention relates generally to plasma systems, and, in particular embodiments, to plasma system and methods of operating thereof.

BACKGROUND

Generally, semiconductor devices used in electronics, such as mobile phones, digital cameras, computers etc., are fabricated by sequentially depositing layers of dielectric, conductive, and semiconductor materials over a semiconductor substrate, and patterning the various layers (including portions of the substrate) using photolithography and etching to form structures that function as circuit components (e.g., transistors, resistors, and capacitors) and as interconnect elements (e.g., conductive lines, contacts and vias). Some components, for example, fin field-effect transistors (FinFETs) and memory cells for non-volatile (NVM) and dynamic random access (DRAM) memory comprise intricate three-dimensional structures to reduce the device footprint. Plasma processing has become indispensable in the deposition and etching processes used to form the structures needed to fabricate semiconductor devices. Examples of plasma-assisted processing include reactive ion etching (RIE), cyclic-etch process (e.g., alternating deposition and etch cycles), plasma-enhanced CVD (PECVD), high density plasma chemical vapor deposition (HDP-CVD), plasma-enhanced atomic layer etch (PEALE), and plasma-enhanced atomic layer deposition (PEALD).

The minimum feature sizes in semiconductor devices have been repeatedly reduced with innovations in lithography (e.g., immersion lithography and multiple patterning) to increase the packing density of components, thereby reducing the cost of integrated circuits (ICs). The insatiable demand for ICs with higher functionality and performance at a lower cost is driving minimum feature sizes to a few nanometers, intensifying the challenges in semiconductor fabrication technology. In particular, plasma processing technology needs to provide the capability of fabricating nanostructures with precise dimensions (e.g., linewidths, etch depth, and film thicknesses) in the nanometer range along with precisely controlled structural features (e.g., etch profile, conformality, and anisotropy), often at atomic scale dimensions, uniformly across a wide (e.g., 300 mm) wafer. In addition, plasma equipment design needs to consider constraints such as wafer throughput, equipment configurability, and equipment cost. Overcoming the hurdles in providing plasma processing technology for manufacturing of scaled semiconductor devices is a challenge that requires further innovations in plasma equipment design.

SUMMARY

In accordance with an embodiment of the present invention, a plasma processing system comprises a plasma processing chamber, a substrate holder disposed in the plasma processing chamber, a coil disposed over the plasma processing chamber, and a plurality of taps configured to contact the coil at an associated contact region. The plasma processing system is configured to sustain a plasma by selecting a subset of taps from the plurality of taps to apply a power source and a reference potential.

In accordance with an alternative embodiment of the present invention, a plasma processing system comprises a plasma processing chamber, a resonant coil disposed adjacent to the plasma processing chamber, where the resonant coil comprising a coil length. A power tap is physically coupled to the resonant coil at substantially a midpoint of the coil length. A controller is configured to switch between a first electrical path and a second electrical path. The first electrical path electrically couples a first position on the resonant coil with a reference potential node. The second electrical path electrically couples a second position on the resonant coil with the reference potential node.

In accordance with an alternative embodiment of the present invention, a method of plasma processing comprises sustaining a first plasma in a plasma processing chamber using a first operational mode by coupling a first contact region of a coil to a reference potential. The method further comprises switching an operational mode from the first operational mode to a second operational mode by removing the coupling to the first contact region and coupling a second contact region of the coil to the reference potential. The method further comprises sustaining a second plasma in the plasma processing chamber using a second operation mode that is different from the first operation mode.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A illustrates the RF power and ground taps for the inductive coupling configuration illustrated in FIG. 2B, wherein the tap locations relative to the two ends of the spiral RF resonator are indicated by showing the taps on a hypothetical uncoiled RF resonator of the same length;

FIG. 3B illustrates the voltage and current stationary waves along the length of the RF resonator at the resonant condition for the configuration illustrated in FIG. 3A;

FIG. 5A illustrates the RF power and ground taps for the capacitive coupling configuration illustrated in FIG. 4B, wherein the tap locations relative to the two ends of the spiral RF resonator are indicated by showing the taps on a hypothetical uncoiled RF resonator of the same length;

FIG. 5B illustrates the voltage and current stationary waves along the length of the RF resonator at the resonant condition for the configuration illustrated in FIG. 5A;

DETAILED DESCRIPTION OF ILLUSTRATIVE EMBODIMENTS

Conventional coil based plasma sources can operate in a mixed capacitive and inductive mode (referred to as ICP-mode), but with no control over the degree of capacitive coupling. The conventional plasma sources may also be operated as resonators in either purely inductive or purely capacitive mode, but are not capable of making a transition between the two modes during operation. There are many potential applications if a transition from purely inductive mode to purely capacitive mode (and vice versa) can be achieved during processing.

Embodiments of the present application disclose mode-switching plasma systems, wherein a plasma processing apparatus can be configured to achieve a fast and smooth transition between a purely inductive coupling mode (PI-mode) and a purely capacitive coupling mode (PC-mode). Embodiments of the present application, as further described below, describe fast switching between the different modes of operation by electrically reconfiguring the connections, e.g., the ground connections, to the plasma coil.

An embodiment of the plasma processing apparatus will first be described using FIG. 1. Operating modes of the plasma processing apparatus, for example, the PI-mode of operation and the PC-mode of operation will be explained using FIGS. 2 and 3, and FIGS. 4 and 5, respectively. Example embodiments of mode-switching plasma systems will then be explained using schematic representations of the systems, illustrated in FIGS. 6 through 8. An example of a plasma process where it may be advantageous to use a mode-switching plasma system will be described schematically using FIG. 9.

Figure 1B:
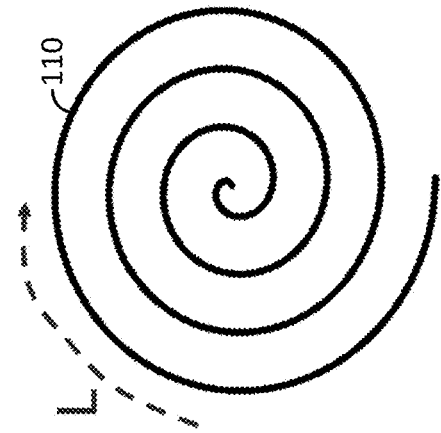
FIG. 1B illustrates a top-view of the planar RF resonator in the plasma processing apparatus illustrated in FIG. 1A.
Figure 1A:
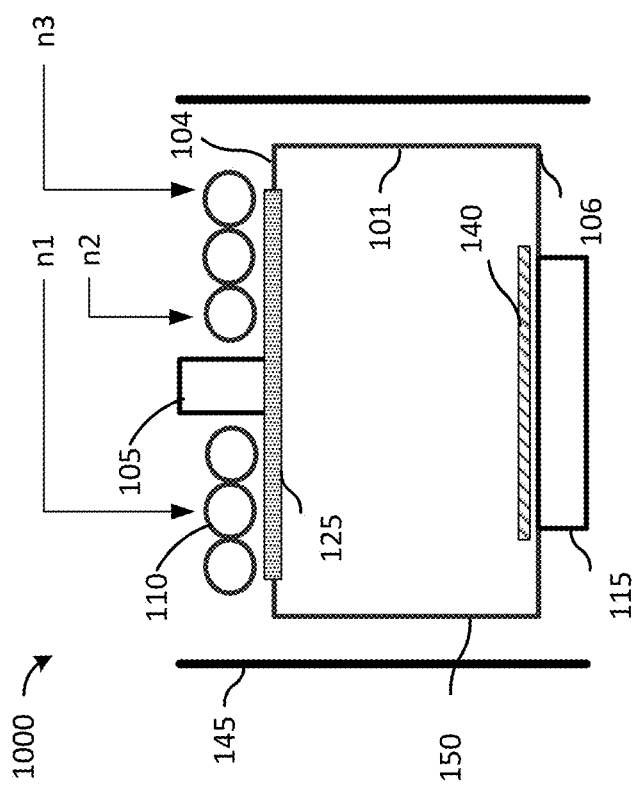
FIG. 1A illustrates a cross-sectional view of a plasma processing apparatus in accordance with an embodiment of the invention.

FIG. 1A illustrates a cross-sectional view of an embodiment of a plasma processing apparatus in accordance with an embodiment of the present invention.

As illustrated in FIG. 1A, the plasma processing apparatus 1000 includes a plasma processing chamber 150 comprising sidewalls 101, a base 106, and a top cover 104 that collectively substantially enclose the plasma processing chamber 150. The sidewalls 101, base 106, and top cover 104 may be made of a conductive material such as stainless steel or aluminum coated with a film such as yttria (e.g., $Y_xO_y$ or $Y_xO_yF_z$), or a film consistent with the process (e.g., carbon or silicon), or as known to a person skilled in the art. At least a portion of the top cover 104 includes a window 125 made of a dielectric material such as quartz. In one embodiment, the plasma processing chamber 150 may be cylindrical and the window 125 of the top cover may be circular.

In one or more embodiments, the plasma processing apparatus 1000 comprises an RF resonator 110 disposed over the window 125 in the top cover 104 of the plasma processing chamber 150. The plasma processing chamber 150 and the RF resonator 110 may be housed within an enclosure 145, which may be a Faraday cage or a solid enclosure.

In one embodiment, the RF resonator 110 disposed over the window 125 is a planar conductive spiral, as seen from the top-view of the RF resonator 110 illustrated in FIG. 1B. During the operation of the plasma processing apparatus 1000, RF power may be coupled from the RF resonator 110 to sustain a plasma discharge in the plasma processing chamber 150 below.

The design of the RF resonator 110, e.g., the number of turns, the diameter of the spiral, the length and thickness of the wire, the wire resistance etc., would be known to a person skilled in the art and therefore not discussed further.

The RF resonator 110 is equipped with multiple taps providing electrical connections to specific locations on the RF resonator 110. Physical and electrical contact to a tap may be made or broken by an external controller by lowering or raising an electrode using, for example, actuators operated with either vacuum or compressed air, as further described below. Configurable electrical nodes such as the nodes n1, n2, and n3, represented schematically in FIG. 1A, may be configured to contact selected taps and connect to electrical equipment, such as mechanical or solid-state switches, RF power sources and ground (the reference potential). As further described below, the mode of operation of the plasma processing apparatus 1000 may be altered programmatically, for example, by altering the electrical configuration of the RF resonator 110 using a programmable controller.

The example embodiment illustrated in FIG. 1A shows a gas input system 105 connected to the plasma processing chamber 150 through a hole in the (e.g., circular) window 125. The gas input system 105 provides process gases into the plasma processing chamber 150. The gas input system 105 may include multiple inputs and may input different gases into the plasma processing chamber 150 through the hole in the window 125. A representative gas outlet 115 is illustrated to be connected to the plasma processing chamber 150 through a gap in the base 106. A gas flow between the gas input system 105 and gas outlet 115 may be maintained by an exhaust pump (not shown) connected to the gas outlet 115. The various inlets and exhausts used for carrier, reactant, or purge gases, as well as any electrodes and electrical connections inside the plasma processing chamber 150 are not shown and would be known to a person having ordinary skill in the art.

In the example illustrated in FIG. 1A, a disc-shaped substrate holder 140 is disposed close to the base 106 of the plasma processing chamber 150. The substrate holder 140 may be configured to hold a wafer during processing. As known to a person skilled in the art, the substrate holder 140 may be connected to additional equipment, for example, dc bias, RF bias, or ground. The dimensions of the substrate holder 140 may be designed relative to the RF resonator 110 and the plasma processing chamber 150, to minimize across-wafer variations.

Although components of the example embodiments illustrated in FIGS. 1A and 1B are described to have specific geometrical shapes and symmetric placements, it is understood that these shapes and symmetric placements are for illustrative purposes only; other embodiments may have other shapes and/or asymmetric placements.

The different operation modes of the plasma processing apparatus 1000 discussed in various embodiments of the invention will be now described using FIGS. 2A through 5B.

As known to a person having ordinary skill in the art, while most of the naturally occurring plasma is thermally generated at very high temperatures, plasma in semiconductor processing equipment may be triggered or ignited by electrical discharge through a gas. Once ignited, the plasma state may be sustained at low temperatures by a high frequency RF power source coupled inductively or capacitively to the plasma, in different embodiments.

First, operation of the plasma processing apparatus 1000 using purely inductive coupling, referred to as the PI-mode, is described with reference to FIGS. 2A through 3B. Operation of the plasma processing apparatus using purely capacitive coupling is referred to as the PC-mode, and is described with reference to FIGS. 4A through 5B.

Figure 2A:
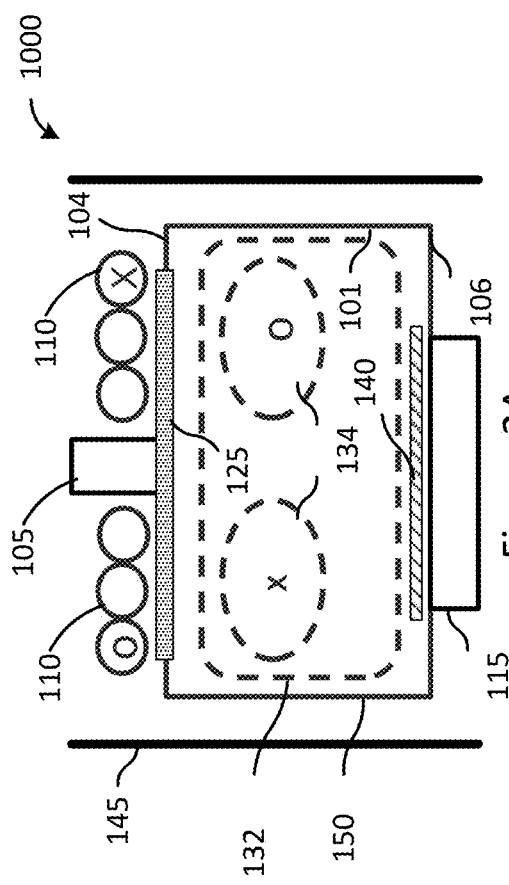
FIG. 2A illustrates a cross-sectional view of the plasma processing apparatus illustrated in FIG. 1A, wherein the apparatus is configured to sustain a plasma by inductively coupled RF power applied to the RF resonator, in accordance with an embodiment of the invention.

Referring now to FIG. 2A, a PI-plasma 132 (indicated by a dashed rectangle inside the plasma processing chamber 150) is shown formed directly below the RF resonator 110 configured in the PI-mode. The PI-plasma 132 extends vertically towards the substrate holder 140 within the plasma processing chamber 150. Being in close proximity or in contact with the substrate being processed, the PI-plasma 132 may be considered to be a direct plasma. The azimuthal electric fields are highest roughly in a toroid region 134 of the PI-plasma 132, indicated by two dashed ellipses in FIG. 2A. Corresponding to the high electric fields, high current oscillations are induced in the toroid region 134. The induced current oscillating in the PI-plasma 132 is nearly 180° out of phase with the oscillating current in the RF resonator 110. For example, at an instant when the coil-current is flowing counterclockwise the plasma-current is flowing clockwise, as indicated by the arrowheads (crosses and dots) in FIG. 2A.

Figure 2B:
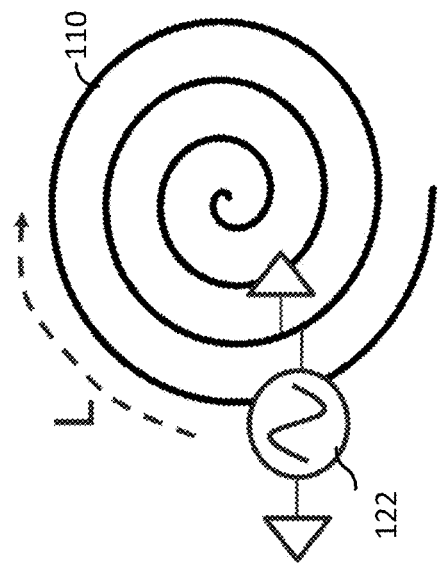
FIG. 2B illustrates a top-view of the RF resonator configured to sustain a plasma by inductive coupling, as illustrated in FIG. 2A.
Figure 2C:
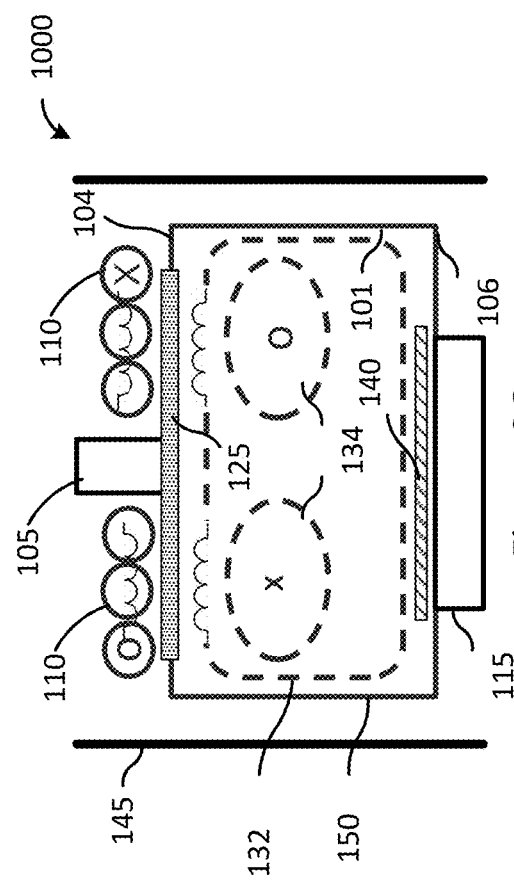
FIG. 2C illustrates the inductive coupling symbolically in the cross-sectional view of the plasma processing apparatus illustrated in FIG. 2A.

FIG. 2B illustrates the electrical configuration of the RF resonator 110 corresponding to the PI-mode of operation used to sustain the PI-plasma 132 in the plasma processing chamber 150, described with reference to FIG. 2A. The two ends of the coil (i.e., RF resonator 110) are open circuit, and an RF power source 122 and a ground connection are made close to each other near the center of the RF resonator 110 (equidistant from the two ends of the spiral). In this configuration, the resonant RF current in the RF resonator 110 may be relatively high and, accordingly, the associated oscillating magnetic field would induce an RF current in the conductive PI-plasma 132. Since the coupling mechanism is similar to the coupling between the primary and secondary coils in a transformer, the inductive coupling between the RF resonator 110 and the PI-plasma 132 is illustrated in FIG. 2C with symbolic transformers in the cross-sectional view of the plasma processing apparatus 1000 operating in the PI-mode, as illustrated in FIG. 2A.

The resonance condition for the PI-mode is further described below with reference to FIGS. 3A-3B.

Electrical resonance in a spiral conductor may be understood by considering a linear conductor 110A constructed by uncoiling the spiral. The schematic shown on the left portion of FIG. 3A illustrates the RF resonator 110, configured identical to the RF resonator 110 in FIG. 2B. The length of the spiral conductor, L, is indicated by the dashed arrow adjacent to the structure of the RF resonator 110. A hypothetical linear conductor 110A of the same dimensions, shown on the right portion of FIG. 3A, represents the uncoiled spiral. Because of the open circuit condition at the two ends, no current flows, i.e., the current is substantially zero. A uniform transmission line or waveguide of length L, terminated by open circuit at the two ends, is a half-wavelength resonator. As known to a person having ordinary skill in the art, a half-wavelength resonator exhibits resonance at discrete frequencies corresponding to L being equal to a multiple of one-half of a wavelength, $\lambda$, or, $L=n\lambda/2$, where n is a whole number. The oscillations at resonance are sustained using power from the RF power source 122 applied at the center of the conductor close to the ground connection, as illustrated in FIG. 3A.

FIG. 3B illustrates the voltage and current stationary waves plotted along the length of the RF resonator 110 at the resonance condition, $L=\lambda/2$, (n=1) for the configuration illustrated in FIG. 3A. The pair of dotted lines represent the oscillating resonant RF current, I(t), and the pair of solid lines represent the oscillating resonant RF voltage, V(t), at times, t, when the magnitudes of I(t) and V(t) are maximum. At resonance, the nodes (amplitude equal to zero) and anti-nodes (amplitude is maximum) of the stationary waves occur at the two ends and the center of the RF resonator 110 or linear conductor 110A, locations where the taps are either open circuit or shorted to ground. As illustrated in FIG. 3B, the two ends (open circuits) are the nodes for I(t) and antinodes for V(t), and the center (short to ground) is an antinode for I(t) and a node for V(t). In the PI-mode configuration, the amplitude of oscillating resonant RF voltage at the RF power source 122 is at its minimum although ideally, for a lossless resonator, the amplitude of voltage at the RF power source 122 would be zero.

Operation of the plasma processing apparatus 1000 using capacitive coupling, referred to as the PC-mode, is described now with reference to FIGS. 4A through 5B.

Figure 4B:
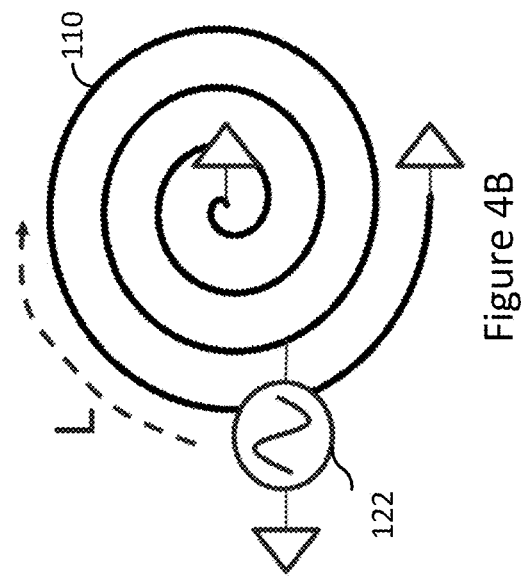
FIG. 4B illustrates a top-view of the RF resonator configured to sustain a plasma by capacitive coupling, as illustrated in FIG. 4A.
Figure 4A:
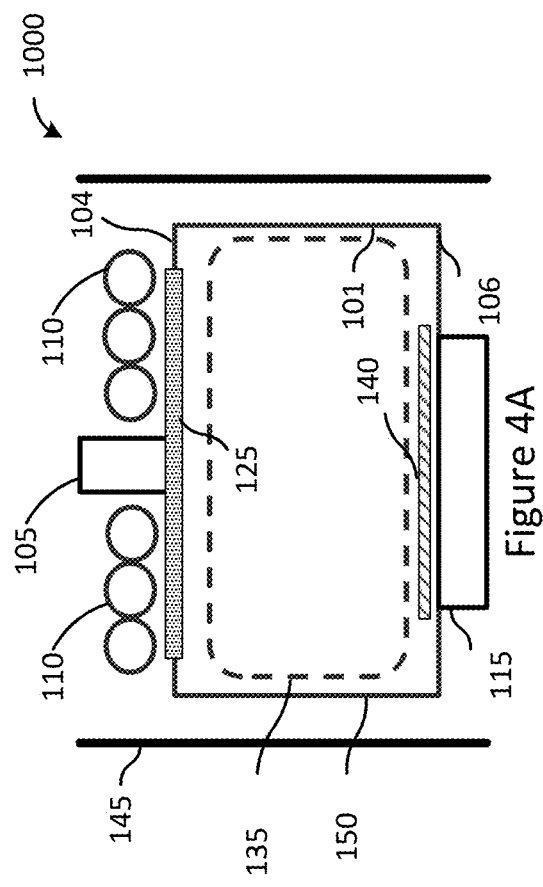
FIG. 4A illustrates a cross-sectional view of the plasma processing apparatus illustrated in FIG. 1A, wherein the apparatus is configured to sustain a plasma by capacitively coupled RF power applied to the RF resonator, in accordance with an embodiment of the invention.

Referring to FIG. 4A, a PC-plasma 135 (indicated by a dashed rectangle inside the plasma processing chamber 150) is shown formed directly below the RF resonator 110 configured in the PI-mode. Similar to the PI-plasma 132, the PC-plasma 135 may be considered to be a direct plasma since PC-plasma 135 extends vertically towards the substrate holder 140 and stays in close proximity to the substrate. Unlike the magnetic coupling in the PI-mode, the coupling in the PC-mode is achieved by a vertical electric field between the RF resonator 110 and the PC-plasma 135, as further understood from the electrical configuration illustrated in FIG. 4B.

Figure 4C:
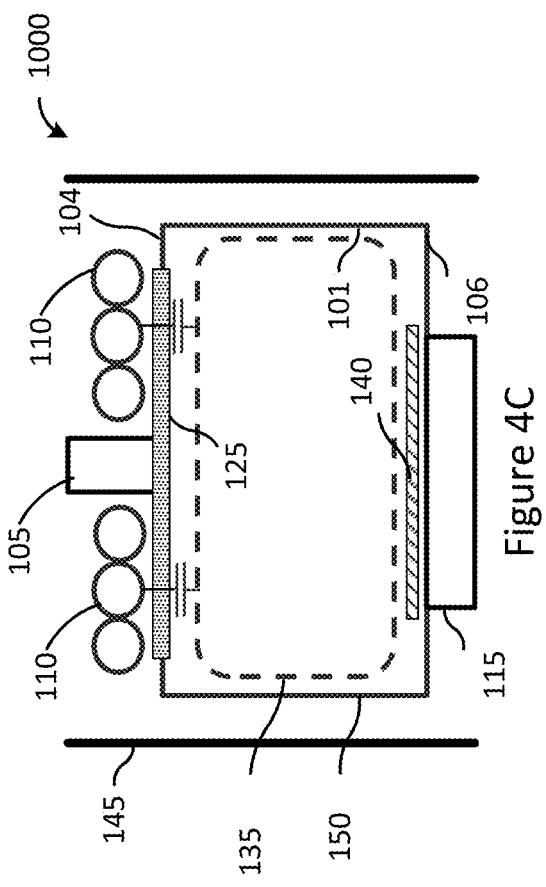
FIG. 4C illustrates the capacitive coupling symbolically in the cross-sectional view of the plasma processing apparatus illustrated in FIG. 4A.

As illustrated in FIG. 4B, instead of grounding the center of the RF resonator 110 (as done in FIG. 2B to operate in the PI-mode), the two ends of the RF resonator 110 are shorted to ground to operate the plasma processing apparatus 1000 in the PC-mode. The RF power source 122 remains connected to the center of the RF resonator 110 (equidistant from the two ends of the spiral). In this configuration, there is a relatively low resonant RF current at the ground connections of the RF resonator 110 and a relatively weak RF magnetic field in the PC-mode compared to resonance in the PI-mode. The resonant RF voltage oscillation in the RF resonator 110 generates a vertical displacement current in the dielectric materials and the sheath between the RF resonator 110 and the conductive PC-plasma 135, thereby causing a vertical RF conduction current inside the PC-plasma 135. Because this coupling mechanism between the RF resonator 110 and the PC-plasma 135 is similar to the coupling between two electrodes of a capacitor, the capacitive coupling described herein is represented in FIG. 4C by symbolic capacitors in the cross-sectional view of the plasma processing apparatus 1000 operating in the PC-mode, as illustrated in FIG. 4A.

The resonance condition for the PC-mode of the RF resonator 110 is explained by analogy to the linear conductor 110A (the uncoiled spiral structure) illustrated in FIG. 5A, similar to the explanation of electrical resonance for the PI-mode (provided using FIGS. 3A and 3B).

In FIG. 5A, the schematic on the left illustrates the RF resonator 110 configured in the PC-mode (identical to FIG. 4B), while the schematic on the right illustrates the uncoiled linear conductor 110A of the same length, L, and in the same electrical configuration. As known to a person having ordinary skill in the art, a uniform transmission line or waveguide of length L, terminated at the two ends by short circuit to ground, is also a half-wavelength resonator. Similar to the PI-mode, the oscillations at resonance in the PC-mode are sustained using power from the RF power source 122 applied at the center of the linear conductor 110A, as illustrated in FIG. 5A.

FIG. 5B illustrates the voltage and current stationary waves plotted along the length of the RF resonator 110 at the resonant condition, L=λ/2, (n=1) for the configuration illustrated in FIG. 5A. The pair of dotted lines represent the oscillating resonant RF current, I(t), and the pair of solid lines represent the oscillating resonant RF voltage, V(t), at times, t, when the magnitudes of I(t) and V(t) are maximum. As illustrated in FIG. 5B, the two ends (shorts to ground) are the nodes for V(t) and antinodes for I(t), and the center of the RF resonator 110 is an antinode for V(t) and a node for I(t). In the PC-mode configuration, the amplitude of oscillating resonant RF current at the RF power source 122 is at its minimum although ideally, for a lossless resonator, the amplitude of current at the RF power source 122 would be zero.

It is understood that, in addition to the half-wavelength resonator configuration, the RF resonator 110 of length L may be configured as a quarter-wavelength resonator by terminating one end of the coil by an open circuit and the other end by a short to ground. As known to a person having ordinary skill in the art, a quarter-wavelength resonator exhibits resonance at discrete frequencies corresponding to L being equal to a multiple of one-quarter of a wavelength, λ, or, L=nλ/4, where n is a whole number. The RF power source 122 used to sustain the oscillations at resonance may be applied either at the grounded end of the coil to operate the plasma processing apparatus 1000 in the PI-mode, or at the opposite end of the coil to operate the plasma processing apparatus 1000 in the PC-mode.

As a person having ordinary skill in the art can appreciate, characteristics of PI-plasmas (e.g., PI-plasma 132) and PC-plasmas (e.g., PC-plasma 135) are different. For example, the ion-to-radical ratio is generally higher in PC-plasmas (ion-rich) relative to PI-plasmas (radical-rich). Differences in plasma properties may be exploited to tailor specific plasma processes applicable to semiconductor manufacturing. In addition, it may be advantageous to make a transition between the two modes of operation, for example, from an ion-rich PC-mode to a radical-rich PI-mode smoothly during the processing.

Examples of mode-switching plasma systems are described with reference to FIGS. 6 through 8. Application of a mode-switching plasma system in processing is described using a schematic representation of a two-step process illustrated in FIG. 9.

Figure 6:
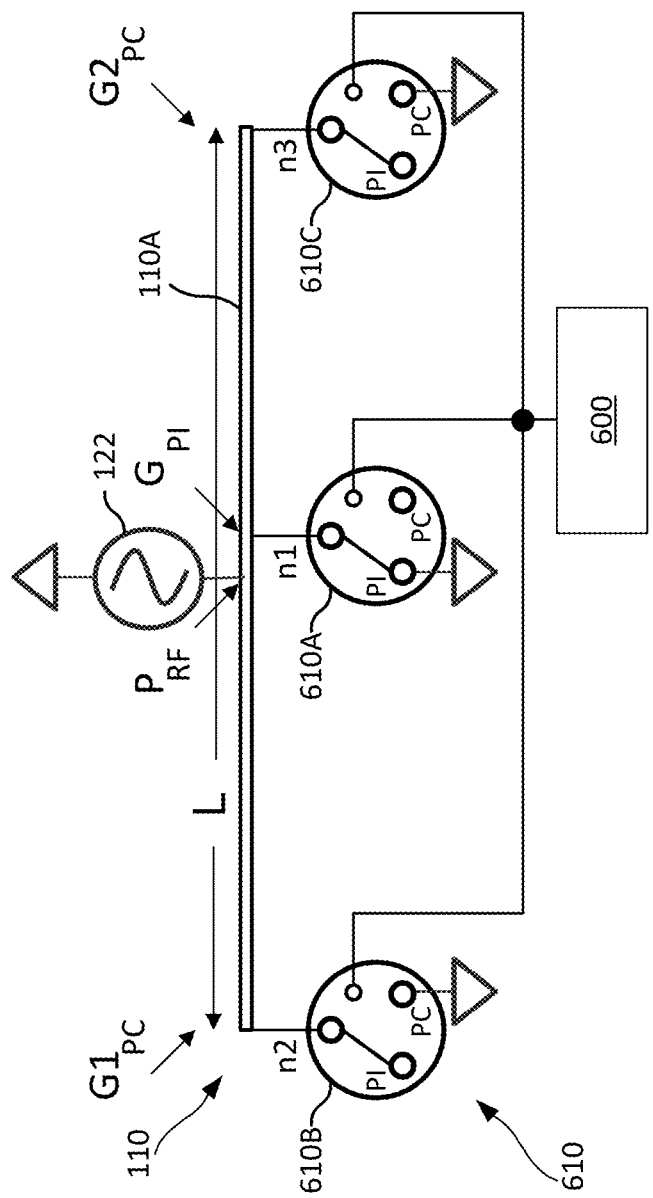
FIG. 6 illustrates a schematic of a mode-switching plasma system wherein the configuration of the plasma processing apparatus illustrated in FIG. 1A is switched between the inductive coupling mode and the capacitive coupling mode using three switches, in accordance with an embodiment of the invention.

The schematic in FIG. 6 illustrates a mode-switching plasma system wherein a switch comprising a plurality of switching devices 610 such as a first switching device 610A, a second switching device 610B, and a third switching device 610C. In one embodiment, each of the plurality of switching devices 610 may be implemented as an electrically configurable single-pole double-throw (SPDT) switch. The first switching device 610A, the second switching device 610B, and the third switching device 610C may be flipped synchronously using signals from a first programmable controller 600 to rapidly change the configuration of a plasma processing apparatus (e.g., the plasma processing apparatus 1000) between two different operating modes (e.g., the PI-mode (see FIG. 3A) and the PC-mode (see FIG. 5A)), in accordance with an embodiment of the present invention. The RF resonator 110 of the plasma processing apparatus 1000 (illustrated in FIGS. 1A and B) is represented in FIG. 6 by the uncoiled linear conductor 110A of the same length, L for clarity. The description of the plasma system is equally applicable to the RF resonator 110.

In FIG. 6, a first center-tap (indicated as $P_{RF}$) in the linear conductor 110A connects to an RF power source 122, and several other taps in the linear conductor 110A connect to respective electrical nodes n1, n2, and n3 (see FIG. 1A). Electrical node n1 is configured to connect a second center-tap (indicated as $G_{PI}$) to a first terminal (the pole) of the first switching device 610A. Electrical node n2 is configured to connect a first end-tap, $G1_{PC}$, to the pole of the second switching device 610B, and electrical node n2 is configured to connect a second end-tap, $G2_{PC}$, to the pole of the third switching device 610C. The pole of any of the plurality of switching devices 610 can be electrically thrown to connect to either a second terminal (referred to as the PI-terminal) or a third terminal (referred to as the PC-terminal), in accordance with an electrical signal sent to a fourth control terminal of the plurality of switching devices 610. As illustrated in FIG. 6, a low resistance ground connection is provided at the PI-terminal of the first switching device 610A and at the PC-terminal of the second and the third switching devices 610B and 610C. The physical location of the plurality of switching devices 610 and the electrical nodes n1-n3 may be in close proximity to the respective taps to ensure that the path length of the RF waves are maintained to satisfy the half-wavelength resonance condition at the RF frequency of the RF source 122.

A first state of the plurality of switching devices 610 is defined by the poles disconnected from the PC-terminals and shorted to the PI-terminals (as shown in FIG. 6), and is referred to as the PI-state. A second PC-state (not shown) is defined when the poles are flipped to the PC-terminals. The control signal used to set the plurality of switching devices 610 to the PI-state or the PC-state may be generated by programming the first programmable controller 600.

The plurality of switching devices 610, as illustrated in FIG. 6, is set to the PI-state, thereby grounding electrical node n1 and, hence, setting the center-tap $G_{PI}$ (connected to node n1) to ground. Simultaneously, the electrical nodes n2 and n3 become floating, thereby setting the two end-taps $G1_{PC}$ and $G2_{PC}$ (connected to nodes n2 and n3, respectively) to open-circuit. At this setting, the plasma processing apparatus 1000 is configured to operate in the PI-mode.

The plurality of switching devices 610 may be flipped by the first programmable controller 600 to the PC-state. In the PC-state, the end-taps $G1_{PC}$ and $G2_{PC}$ are shorted to ground and, at the center, only the RF power source 122 remains connected to $P_{RF}$ ($G_{PI}$ is open-circuit). At this setting the plasma processing apparatus 1000 is configured to operate in the PC-mode.

The plurality of switching devices 610, shown schematically in FIG. 6, may be physically implemented using, for example, a programmable electromechanical relay or a solid-state electronic relay. Electromechanical relays use movable electrodes operated electrically, e.g., by a electromagnet, whereas solid-state electronic relays have no movable parts as they use semiconductor switches, such as insulated-gate bipolar transistors (IGBT), thyristors, and the like.

In FIG. 6, plurality of switching devices 610 synchronized with one control signal from a programmable controller 600 has been used to switch the operating mode of the plasma processing apparatus 1000. However, it is understood by a person skilled in the art that other types of switches using a different number of control signals may be used to perform the same switching function of flipping the configuration of the RF resonator 100 to operate between the PI-mode and the PC-mode. For example, three electrically configurable single-pole single-throw (SPST) switches may be used to flip the connection of the respective taps of the coil between ground and open using two synchronous control signals generated by a programmable controller.

Figure 7B:
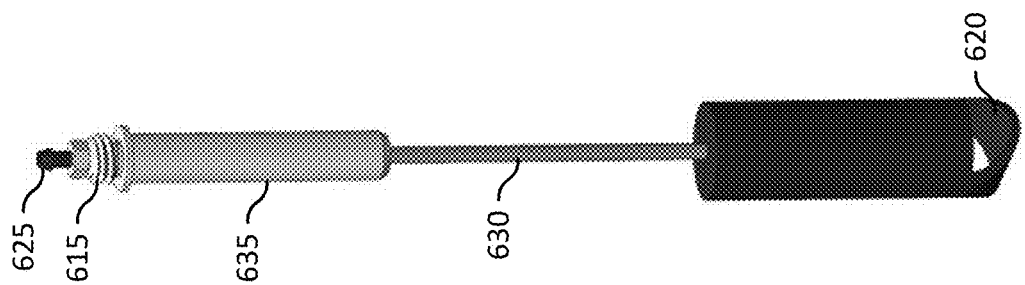
FIG. 7B illustrates a detailed view of a retractable electrode used to contact taps of the RF resonator in the plasma processing apparatus illustrated in FIG. 7A.
Figure 7A:
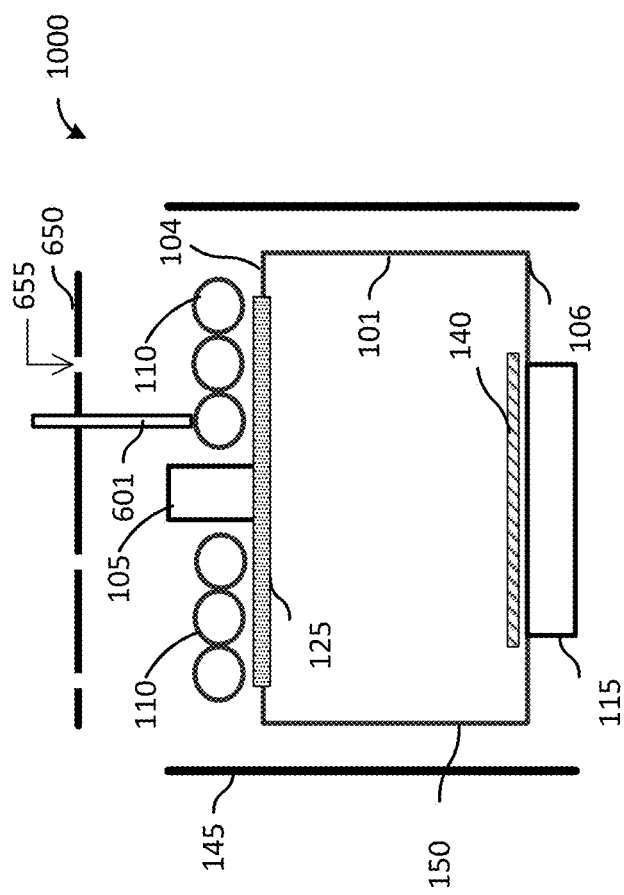
FIG. 7A illustrates a cross-sectional view of the plasma processing apparatus illustrated in FIG. 1A fitted with retractable electrodes used to contact taps of the RF resonator, in accordance with an embodiment of the invention.
Figure 7C:
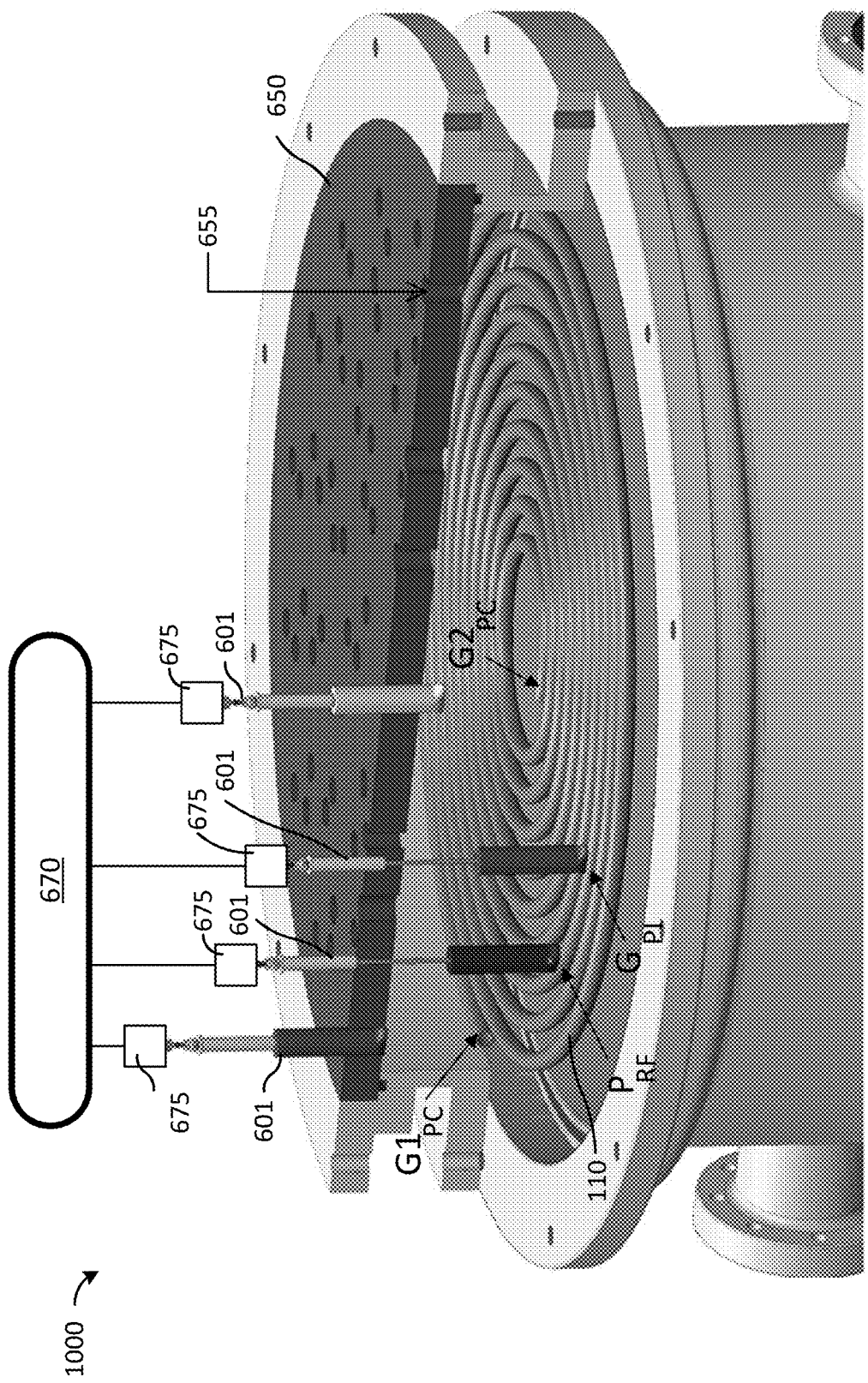
FIG. 7C illustrates a cut away perspective view of a mode-switching plasma system wherein the configuration of the plasma processing apparatus illustrated in FIG. 7A is switched between the inductive coupling mode and the capacitive coupling mode using retractable electrodes, in accordance with an embodiment of the invention.

FIGS. 7A through 7C illustrate a mode-switching plasma system wherein retractable electrodes 601 are utilized to make or break contact with taps in an RF resonator such as the taps $P_{RF}$, $G_{P1}$, $G1_{PC}$, and $G2_{PC}$ to the linear conductor 110A (see FIG. 6). In the example embodiment illustrated in FIGS. 7A through 7C, each retractable electrode 601 may be independently extended or retracted by a built-in actuator 635, as described in further detail below. When extended, the retractable electrode 601 is lowered and makes contact with a tap; the contact may be broken by retracting the retractable electrode 601 to its raised position. Mode-switching is achieved by programming the actuators 635 to configure a plasma processing apparatus, such as the plasma processing apparatus 1000 (see FIG. 1A), to operate in a selected mode such as the PI-mode (see FIGS. 2 and 3) or the PC-mode (see FIGS. 4 and 5).

Referring to FIG. 7A, the plasma processing apparatus 1000 (illustrated in FIG. 1A) is shown fitted with retractable electrodes 601 inserted in holes 655 of a cover-plate 650 disposed over the RF resonator 110. The retractable electrodes 601 may be electrically conducting while the cover-plate 650 may be insulating. In FIG. 7A, a representative retractable electrode 601 is shown in the lowered position making contact with a tap in the RF resonator 110.

FIG. 7B illustrates a detailed view of the example retractable electrode 601 in its extended position. In this example, a conductive cylinder 620 having a flexible contact at the bottom is attached to a conductive retractable rod 630 at the top of the cylinder 620. The retractable rod 630 may be extended or retracted by an actuator 635 comprising movable conductive cylinders. The actuator 635 in FIG. 7B may be operated with variable air pressure obtained, for example, from a compressor or vacuum system that may be connected to an actuator inlet 625 located at the top of the actuator 635. Electrical connection to the conductive retractable electrode 601 may be made by attaching a wire at a connector 615 placed above the movable cylinders of the actuator 635, as illustrated in FIG. 7B.

FIG. 7C illustrates a cut away perspective view of a mode-switching plasma system fitted with four retractable electrodes 601 inserted in holes 655 of the cover-plate 650 disposed directly over the two center-taps $P_{RF}$ and $G_{PI}$, and the two end-taps $G1_{PC}$ and $G2_{PC}$ located at the two extremes of the RF resonator 110 of the plasma processing apparatus 1000. A programmable valve 675 controlled by a second programmable controller 670 is shown schematically at the inlet of each of the retractable electrodes 601 in FIG. 7C. The programmable valves 675 may be connected to a gas distribution system comprising compressors, vacuum pumps, and gas lines.

The plasma processing apparatus 1000 in FIG. 7C may be configured by the second programmable controller 670 to operate in a specified mode. As described above with reference to FIGS. 2 and 3, PI-plasma may be sustained with an RF power source 122 and a ground connected to two neighboring center-taps of the RF resonator 110 of the plasma processing apparatus 1000. Using the programmable valves 675, the second programmable controller 670 may selectively raise or lower the retractable electrodes 601 and, thereby, mechanically configure the taps of the RF resonator 110 (e.g., the taps $P_{RF}$, $G_{PI}$, $G1_{PC}$, and $G2_{PC}$) to make or break contact with the respective retractable electrodes 601. The second programmable controller 670 may electrically configure the taps of the RF resonator 110 by selectively connecting the retractable electrodes 601 to external electrical components such as an RF power source or a ground connection. For example, as illustrated in FIG. 7C, two of the retractable electrodes 601 have been lowered to make contact to the two center-taps, $P_{RF}$ and $G_{PI}$, and the remaining two retractable electrodes 601 are in their raised position. With contacts made to the taps of the RF resonator 110 as depicted in FIG. 7C, the second programmable controller 670 may electrically connect an RF power source to the retractable electrode 601 making contact with tap $P_{RF}$ and connect ground to the retractable electrode 601 making contact with tap $G_{PI}$, thereby configuring the plasma processing apparatus 1000 to operate in the PI-mode.

The second programmable controller 670 may, likewise, be programmed to operate the plasma processing apparatus 1000 in the PC-mode. As described above with reference to FIGS. 4 and 5, a PC-plasma may be sustained in the plasma processing chamber 150 of the plasma processing apparatus 1000 with an RF power source 122 connected to a center-tap while grounding the taps at the two ends of the RF resonator 110. Accordingly, the second programmable controller 670 may raise the retractable electrode 601 directly over the center-tap $G_{PI}$ and, at the same time, the second programmable controller 670 may contact the center-tap $P_{RF}$ and the end-taps $G1_{PC}$ and $G2_{PC}$ by lowering the retractable electrodes 601 inserted in holes 655 formed directly over the respective taps. Using this configuration, the second programmable controller 670 may operate the plasma processing apparatus 1000 in the PC-mode by connecting an RF power source to the center-tap $P_{RF}$ and, concurrently, connecting ground to the end-taps $G1_{PC}$ and $G2_{PC}$ via the respective retractable electrodes 601.

In the embodiments described above, controllers (e.g., first programmable controller 600, second programmable controller 670, or third programmable controller 700) have been used to configure electrical connections (e.g., ground connections) to taps in RF resonators by using electrically operated switches and/or by mechanically raising/lowering retractable electrodes. However, the location of each connector over the taps relative to the locations of the taps within the RF resonator has been kept fixed. In some other embodiments, electrical connectors may be mechanically positioned at programmable locations along the RF resonator, for example, by horizontally re-positioning electrodes over a planar RF resonator, as may be done in the example embodiment illustrated in FIGS. 8A and 8B.

Figure 8A:
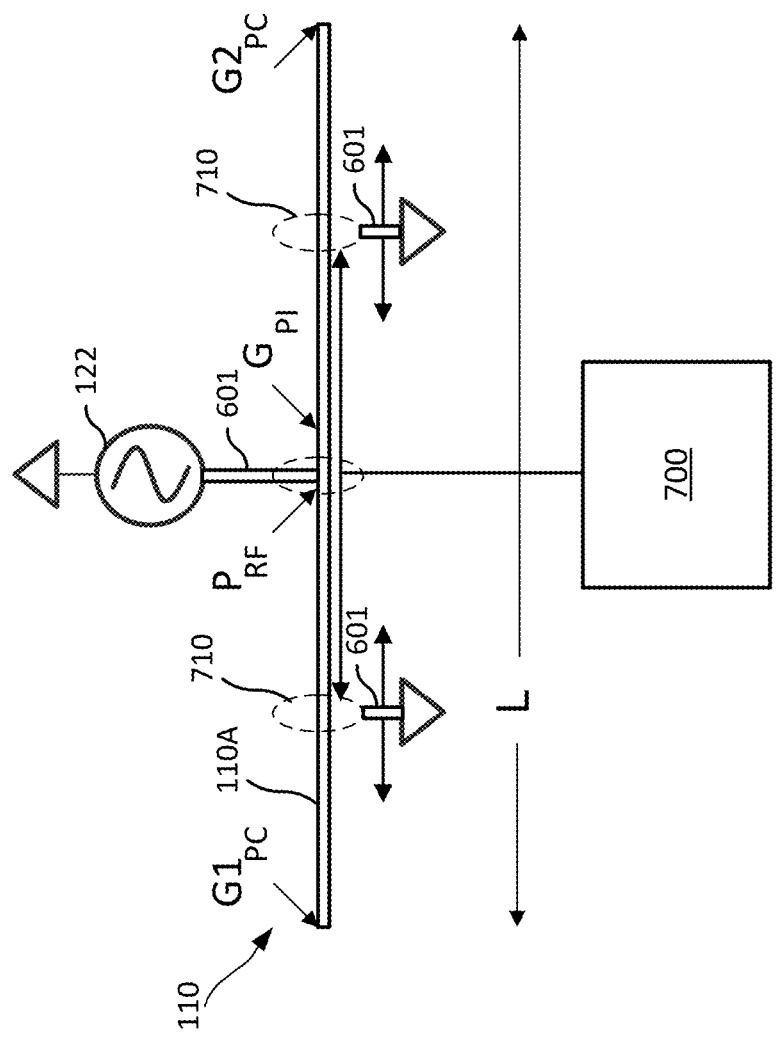
FIG. 8A illustrates a schematic of a mode-switching plasma system comprising the plasma processing apparatus illustrated in FIG. 1A fitted with retractable electrodes positioned on sliding rails, in accordance with an embodiment of the invention.
Figure 8B:
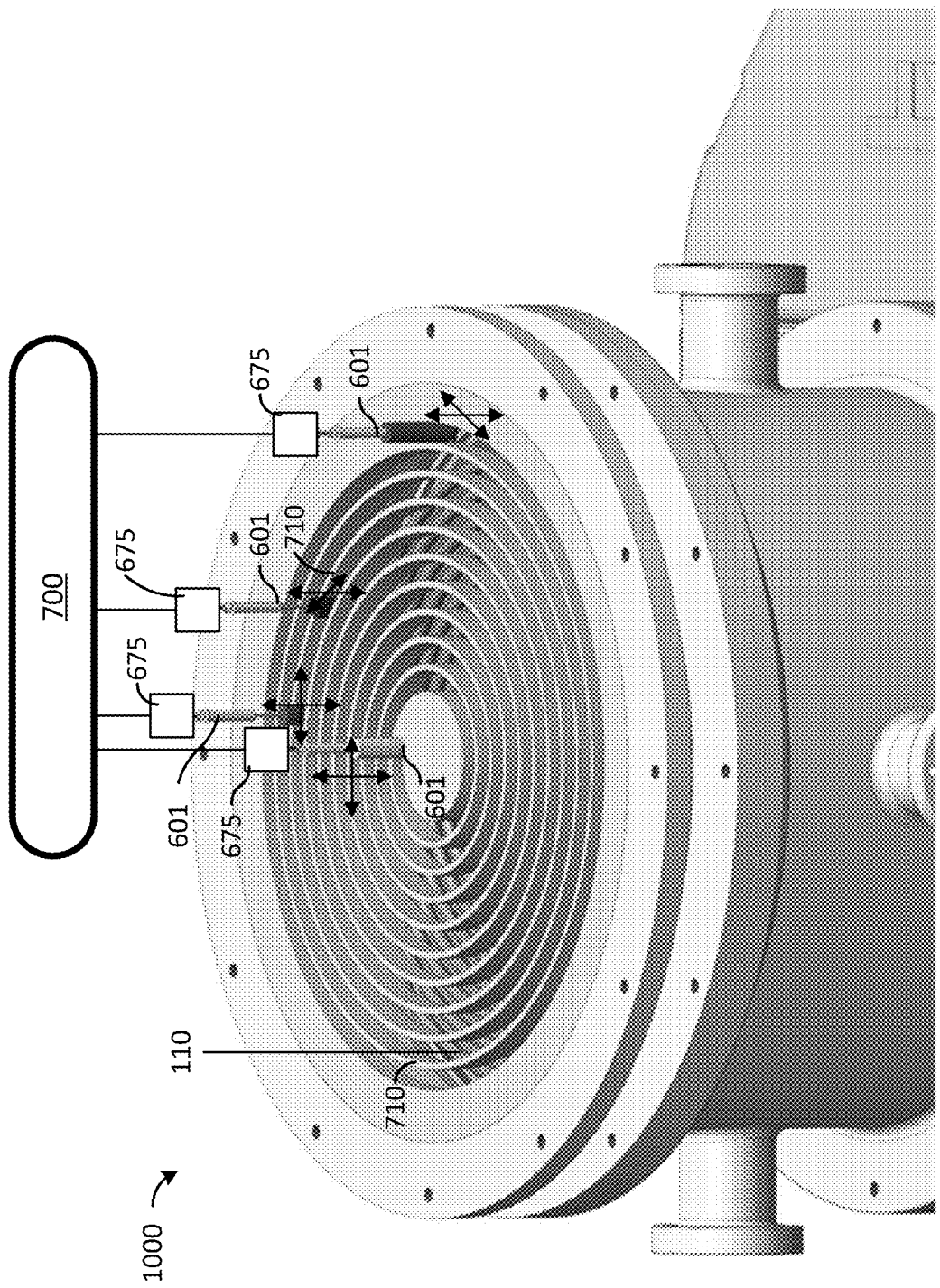
FIG. 8B illustrates a perspective view of the mode-switching plasma system illustrated in FIG. 8A.

The schematic in FIG. 8A illustrates a mode-switching plasma system wherein a third programmable controller 700 may smoothly slide one or more connectors (e.g., retractable electrodes 601) along rails 710 (indicated schematically by dashed ovals) to position the connectors over taps placed at various locations along the length L of the representative uncoiled linear conductor 110A. The uncoiled linear conductor 110A is used for clarity in FIG. 8A (similar to FIG. 6). The retractable electrodes 601 may be mechanically coupled, for example, to servo motors controlled by the third programmable controller 700 in order to precisely position the connectors over the selected taps in the RF resonator 110. In FIG. 8A, the retractable electrode 601 connected to the RF power source 122 is shown making contact with the center-tap $P_{RF}$, and the pair of retractable electrodes 601 configured as ground connections are shown sliding along the rails 710. FIG. 8B shows a perspective view of the mode-switching plasma system illustrated in FIG. 8A. The fourth electrode, shown in FIG. 8B, is optional. The mechanics and control of the vertical motion of the retractable electrodes 601 in FIGS. 8A and 8B may be same as described above with reference to FIGS. 7A through 7C. Movement of the sliding connectors (e.g., the retractable electrodes 601 in FIGS. 8A and 8B) is indicated schematically by double arrows in FIGS. 8A and 8B.

The plasma processing apparatus 1000 of the mode-switching plasma system, illustrated in FIGS. 8A and 8B, may be configured to operate between the PI-mode and the PC-mode by appropriately positioning the grounded retractable electrodes 601 using the third programmable controller 700 while, concurrently, connecting the RF power source 122 to the first center-tap $P_{RF}$. A second center-tap, $G_{PI}$, is shown (in FIG. 8A) located close to the first center-tap $P_{RF}$. As described above, with the RF power source 122 connected to the first center-tap $P_{RF}$, the plasma processing apparatus 1000 operates in the PI-mode when the second center-tap $G_{PI}$ is connected to ground and, in the PC-mode when the end-taps $G1_{PC}$ and $G2_{PC}$ are connected to ground. The plasma system illustrated in FIGS. 8A and 8B may be configured to a desired mode by programming the third programmable controller 700 to position the retractable electrodes to make contact with the appropriate taps and route connections to the RF power source 122 and ground, in accordance with the operating mode selected. Each of the retractable electrodes 601 may be precisely positioned horizontally along the rails 710 (using, for example, servo motors) and vertically to the raised or lowered level (using, for example, the programmable valves 675) to contact the respective taps in the RF resonator 110.

Although the embodiments in this disclosure are described in the context of plasma processing apparatus using planar RF resonators, it is understood that a person having ordinary skill in the art may apply the inventive aspects of the illustrative embodiments described herein to plasma processing apparatus utilizing other components such as a helical coil, or a conical coil, or the like, to couple to an RF power source to sustain a plasma.

Different plasma processing steps may prefer different plasma properties. Plasma-assisted sputtering (physically removing material by bombarding a surface with accelerated ions), for example, is a technique where an ion-rich plasma would be preferred. In contrast, some plasma etching and deposition techniques using chemical reactions involving radicals may prefer to use a radical-rich plasma discharge. Mode-switching plasma systems may facilitate efficient implementation of multi-step plasma processes, such as cyclic-etch and cyclic-deposition processes. It may be advantageous to be able to switch the plasma processing apparatus between the PC-mode and the PI-mode since this may facilitate implementing each step of the multi-step plasma process with its preferred set of plasma properties. One cycle of a cyclic-etch or cyclic-deposition processes may comprise a plasma etch step followed by a plasma deposition step. Different ion-to-radical ratios may be used for the etch step and the deposition step. For example, if the etch steps prefer more ions while the deposition steps prefer more radicals, then a mode-switching plasma system may be used to configure the plasma processing apparatus in the PC-mode to provide an ion-rich plasma for the etch process steps, and in the PI-mode to provide a radical-rich plasma for the deposition process steps.

Figure 9:
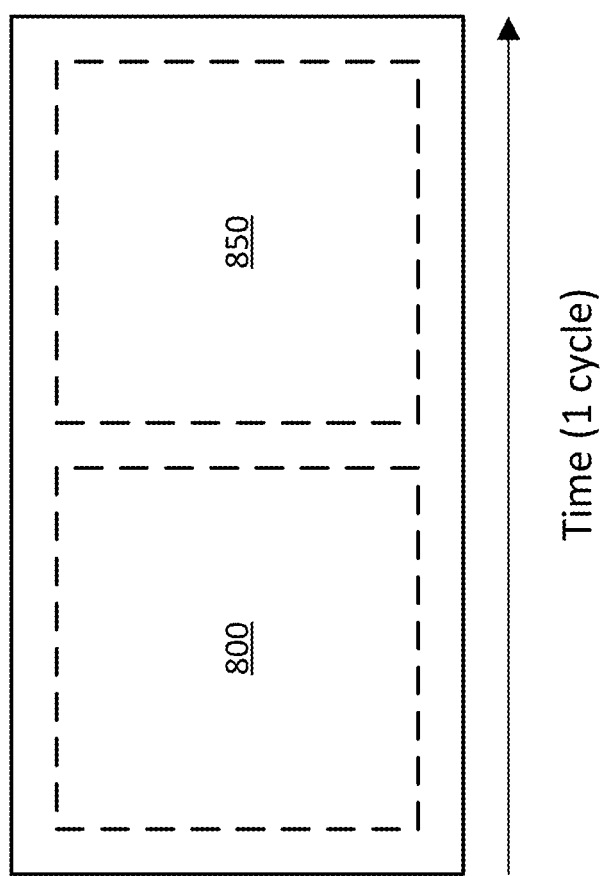
FIG. 9 illustrates a schematic of one processing cycle of a multi-step plasma process using a mode-switching plasma system, in accordance with an embodiment of the invention.

FIG. 9 illustrates one cycle of a multi-step semiconductor process comprising a first process step 800 followed by a second process step 850. For example, the semiconductor process may be a cyclic-etch Bosch process wherein the first process step 800 may be an anisotropic RIE step and the second process step may be a passivating liner deposition step using PECVD.

In one or more embodiments, a mode-switching plasma system, such as the system illustrated in FIG. 6, 7, or 8, may be used to configure the plasma processing apparatus to operate alternately between the PC-mode to provide the ions for the RIE step and the PI-mode to provide the radicals for the PECVD step.

For example, in one embodiment, retractable electrodes 601 fitted with programmable valves 675, servo motors to slide the retractable electrodes 601 along rails 710, and the third programmable controller 700 to control the position and electrical connections to the retractable electrodes 601, may be used to configure the plasma processing apparatus to operate alternately between the PC-mode to provide the ions for the RIE step and the PI-mode to provide the radicals for the PECVD step. As described above with reference to FIGS. 8A and 8B, the plasma processing apparatus 1000 may be configured to operate in the PC-mode or in the PI-mode by programming the third programmable controller 700.

Example embodiments of the invention are summarized here. Other embodiments can also be understood from the entirety of the specification as well as the claims filed herein.

Example 1. A plasma processing system including: a plasma processing chamber; a substrate holder disposed in the plasma processing chamber; a coil disposed over the plasma processing chamber, and a plurality of taps configured to contact the coil at an associated contact region, where the plasma processing system is configured to sustain a plasma by selecting a subset of taps from the plurality of taps to apply a power source and a reference potential.

Example 2. The system of example 1, where the plasma processing system is configured to sustain an inductively coupled plasma in a first operating mode and a capacitively coupled plasma in a second operating mode by selecting a different subset of taps from the plurality of taps to apply the power source and the reference potential.

Example 3. The system of one of examples 1 or 2, further including a switch configured to operate the system in a first operating mode and a second operating mode, where in the first operating mode, the switch is configured to couple the power source to a first tap from the plurality of taps, the first tap located substantially at a midpoint of the coil along a length of the coil and to couple the reference potential to a second tap from the plurality of taps, the second tap neighboring the first tap, and where in the second operating mode, the switch is configured to couple the power source to the first tap and to couple the reference potential to a third tap from the plurality of taps and a fourth tap from the plurality of taps, the third tap and the fourth tap being located at the ends of the coil.

Example 4. The system of one of examples 1 to 3, where the switch includes an electromechanical relay or a solid-state electronic relay.

Example 5. The system of one of examples 1 to 4, where the switch includes a plurality of switching devices configured to operate synchronously to couple the reference potential to the second tap in the first operating mode and to couple the reference potential to the third and fourth taps in the second operating mode.

Example 6. The system of one of examples 1 to 5, further including a controller to control the switch.

Example 7. The system of one of examples 1 to 6, further including: retractable electrodes configured to contact the plurality of taps; and a programmable controller configured to slide the retractable electrodes.

Example 8. The system of example 7, further including: a servo motor, where the retractable electrodes are mechanically coupled to the servo motors controlled by the programmable controller.

Example 9. A plasma processing system including: a plasma processing chamber; a resonant coil disposed adjacent to the plasma processing chamber, the resonant coil including a coil length; a power tap physically coupled to the resonant coil at substantially a midpoint of the coil length; a controller configured to switch between a first electrical path and a second electrical path; where the first electrical path electrically couples a first position on the resonant coil with a reference potential node; and where the second electrical path electrically couples a second position on the resonant coil with the reference potential node.

Example 10. The system of example 9, further including: a switch including a first terminal electrically coupled to the first position and a second terminal electrically coupled to the second position; and where the controller is further configured to switch between the first electrical path and the second electrical path by electrically signaling the switch to switch between the first terminal and the second terminal.

Example 11. The system of one of examples 9 or 10, where the switch includes an electromechanical relay or a solid-state electronic relay.

Example 12. The system of one of examples 9 to 11, further including: retractable electrodes configured to activate the first electrical path or the second electrical path.

Example 13. The system of example 12, further including: a programmable controller configured to slide the retractable electrodes; and a servo motor, where the retractable electrodes are mechanically coupled to the servo motors controlled by the programmable controller.

Example 14. A method of plasma processing, the method including: sustaining a first plasma in a plasma processing chamber using a first operational mode by coupling a first contact region of a coil to a reference potential; switching an operational mode from the first operational mode to a second operational mode by removing the coupling to the first contact region and coupling a second contact region of the coil to the reference potential; and sustaining a second plasma in the plasma processing chamber using a second operation mode that is different from the first operation mode.

Example 15. The method of example 14, further including using a switch to couple the reference potential with the first contact region in the first operating mode and the reference potential with the second contact region in the second operating mode.

Example 16. The method of one of examples 14 or 15, further including using retractable electrodes to couple the reference potential with the first contact region in the first operating mode and the reference potential with the second contact region in the second operating mode.

Example 17. The method of one of examples 14 to 16, where, in the first operational mode, the first plasma is inductively coupled to the coil, and where, in the second operational mode, the second plasma is capacitively coupled to the coil.

Example 18. The method of one of examples 14 to 17, where, in the first operating mode, a power source is coupled to a first tap from a plurality of taps located substantially at a midpoint of the coil along a length of the coil and the reference potential is coupled to a second tap, associated with the first contact region, from the plurality of taps, the second tap neighboring the first tap; and where, in the second operating mode, the power source is coupled to the first tap and the reference potential is coupled to a third tap, associated with the second contact region, from the plurality of taps and a fourth tap from the plurality of taps, the third tap and the fourth tap being located at the ends of the coil.

Example 19. The method of one of examples 14 to 18, where sustaining the first plasma includes: coupling the reference potential to a first tap from a plurality of taps to the coil, the first tap contacting the coil at the first contact region; and coupling a power source to a second tap from the plurality of taps, the second tap located substantially at a midpoint of the coil along a length of the coil, the second tap neighboring the first tap.

Example 20. The method of one of examples 14 to 19, where switching the operational mode includes: disconnecting the reference potential from the first tap; and coupling the reference potential to a third tap from the plurality of taps and a fourth tap from the plurality of taps, the third tap and the fourth tap being located at the ends of the coil.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A plasma processing system comprising:
  a plasma processing chamber;
  a substrate holder disposed in the plasma processing chamber;
  a coil disposed over the plasma processing chamber;

a plurality of taps configured to contact the coil at an associated contact region, the plurality of taps comprising
   a first tap located substantially at a midpoint of the coil along a length of the coil,
   a second tap neighboring the first tap,
   a third tap located substantially at a first end of the coil, and
   a fourth tap located substantially at a second end of the coil,
wherein the plasma processing system is configured to sustain a plasma by selecting a subset of taps from the plurality of taps to apply a power source and a reference potential; and
a switch configured to operate the system in a first operating mode and a second operating mode,
wherein in the first operating mode, the switch is configured to couple the power source to the first tap of the plurality of taps, and to couple the reference potential to the second tap of the plurality of taps, and
wherein in the second operating mode, the switch is configured to couple the power source to the first tap and to couple the reference potential to the third tap of the plurality of taps and the fourth tap of the plurality of taps.

2. The system of claim 1, wherein the switch comprises a solid state electronic relay.

3. The system of claim 1, wherein the plasma processing system is configured to sustain an inductively coupled plasma in the first operating mode and a capacitively coupled plasma in the second operating mode by selecting a different subset of taps from the plurality of taps to apply the power source and the reference potential.

4. The system of claim 1, wherein the switch comprises an electromechanical relay.

5. The system of claim 1, wherein the switch comprises a plurality of switching devices configured to operate synchronously to couple the reference potential to the second tap in the first operating mode and to couple the reference potential to the third and fourth taps in the second operating mode.

6. The system of claim 5, further comprising a controller to control the switch.

7. The system of claim 6, wherein the controller is configured to switch between the first operating mode and the second operating mode by electrically signaling the switch to switch between the second tap and the third and fourth taps.

8. A plasma processing system comprising:
a plasma processing chamber;
a resonant coil disposed adjacent to the plasma processing chamber, the resonant coil comprising a coil length;
a power tap physically coupled to the resonant coil at substantially a midpoint of the coil length;
a switch comprising a first terminal electrically coupled to a first position on the resonant coil and a second terminal electrically coupled to a second position on the resonant coil;
a controller configured to switch between a first electrical path and a second electrical path using the switch;
wherein the first electrical path electrically couples the first position with a reference potential node; and
wherein the second electrical path electrically couples the second position with the reference potential node.

9. The system of claim 8, wherein the controller is further configured to switch between the first electrical path and the second electrical path by electrically signaling the switch to switch between the first terminal and the second terminal.

10. The system of claim 9, wherein the switch comprises an electromechanical relay.

11. The system of claim 8, wherein the switch comprises a solid state electronic relay.

12. The system of claim 8, wherein the switch comprises a plurality of switching devices configured to operate synchronously to couple the first position to the reference potential and to couple the second position to the reference potential.

13. A method of plasma processing, the method comprising:
sustaining a first plasma in a plasma processing chamber using a first operational mode by coupling a first contact region of a coil to a reference potential;
switching an operational mode using a switch from the first operational mode to a second operational mode by removing the coupling to the first contact region and coupling a second contact region of the coil to the reference potential; and
sustaining a second plasma in the plasma processing chamber using a second operation mode that is different from the first operation mode.

14. The method of claim 13, wherein switching the operational mode using the switch further comprises:
using the switch to couple the reference potential with the first contact region in the first operating mode and the reference potential with the second contact region in the second operating mode.

15. The method of claim 13, wherein, in the first operational mode, the first plasma is inductively coupled to the coil, and wherein, in the second operational mode, the second plasma is capacitively coupled to the coil.

16. The method of claim 15,
wherein, in the first operating mode, a power source is coupled to a first tap from a plurality of taps located substantially at a midpoint of the coil along a length of the coil and the reference potential is coupled to a second tap, associated with the first contact region, from the plurality of taps, the second tap neighboring the first tap; and
wherein, in the second operating mode, the power source is coupled to the first tap and the reference potential is coupled to a third tap, associated with the second contact region, from the plurality of taps and a fourth tap from the plurality of taps, the third tap and the fourth tap being located at the ends of the coil.

17. The method of claim 13, wherein sustaining the first plasma comprises:
coupling the reference potential to a first tap from a plurality of taps to the coil, the first tap contacting the coil at the first contact region; and
coupling a power source to a second tap from the plurality of taps, the second tap located substantially at a midpoint of the coil along a length of the coil, the second tap neighboring the first tap.

18. The method of claim 17, wherein switching the operational mode comprises:
disconnecting the reference potential from the first tap; and
coupling the reference potential to a third tap from the plurality of taps and a fourth tap from the plurality of taps, the third tap and the fourth tap being located at the ends of the coil.

19. The method of claim 13, wherein the switch comprises an electromechanical relay.

20. The method of claim 13, wherein the switch comprises a solid state electronic relay.

* * * * *